United States Patent
Luo

(10) Patent No.: US 11,177,782 B2
(45) Date of Patent: Nov. 16, 2021

(54) LOW COST WIDEBAND TUNABLE LNA

(71) Applicant: pSemi Corporation, San Diego, CA (US)

(72) Inventor: Cheng-Kai Luo, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 55 days.

(21) Appl. No.: 16/750,790

(22) Filed: Jan. 23, 2020

(65) Prior Publication Data
US 2021/0234518 A1 Jul. 29, 2021

(51) Int. Cl.
*H03F 1/22* (2006.01)
*H03F 3/195* (2006.01)
*H04B 1/00* (2006.01)
*H03F 1/56* (2006.01)

(52) U.S. Cl.
CPC ............. *H03F 3/195* (2013.01); *H03F 1/565* (2013.01); *H04B 1/0067* (2013.01); *H03F 2200/111* (2013.01); *H03F 2200/21* (2013.01); *H03F 2200/216* (2013.01); *H03F 2200/222* (2013.01); *H03F 2200/271* (2013.01); *H03F 2200/294* (2013.01); *H03F 2200/451* (2013.01)

(58) Field of Classification Search
CPC ........................................................ H03F 1/22
USPC .................................................... 330/311, 310
See application file for complete search history.

(56) References Cited

U.S. PATENT DOCUMENTS 10,110,166 B1 * 10/2018 Noori ........................ H03F 3/72

* cited by examiner

*Primary Examiner* — Henry Choe
(74) *Attorney, Agent, or Firm* — Steinfl + Bruno LLP

(57) ABSTRACT

Methods and devices to fabricate low-cost wideband LNAs that are tunable to multiple frequency bands. Decoupling capacitors are used as part of a tuning circuit implemented at the LNA input. The capacitors are switchably selectable to also tune a signal into desired frequency bands.

14 Claims, 2 Drawing Sheets

200

LOW COST WIDEBAND TUNABLE LNA

BACKGROUND

(1) Technical Field

The present disclosure is related to low noise amplifiers (LNA), and more particularly to methods and apparatus for low cost, wideband and tunable LNAs.

(2) Background

Throughout this document, the terms "decoupling" or "decoupling functionality" refer to the function of allowing the AC current and blocking the DC current to pass from a first point to a second point in an electronic circuit by implementing one or more capacitors connecting the first point to the second point of the electronic circuit.

LNAs are commonly used as part of radio frequency (RF) receiver front-ends to amplify an input signal and provide a corresponding amplified output signal. The bandwidth requirements of many frequency bands are quite challenging for LNAs. More in particular, at the input, ability to tune to wider frequency ranges and/or multiple bands is highly desired.

FIG. 1 shows a prior art LNA (100) including a pair of transistors (T1, T2) connected in a cascode configuration to provide amplification to an input signal. The LNA (100) further includes a direct current (DC) decoupling capacitor (C0) connected to inductor (L1). The gate DC bias is supplied by the supply voltage (Vg) via resistor (R). Inductor (L1) is used as part of the input tuning design to tune into a desired frequency band. Solutions implementing two or more switchable inductors are also provided, wherein one or more inductors can be switched in and out to provide tunability to multiple bands.

SUMMARY

Methods and devices described in the present disclosure may be used to design tunable, wideband LNAs capable of tuning into multiple bands. As will be described more in detail, the disclosed methods and devices provide lower cost solutions requiring less space or/and less matching inductors that are costly.

According to a first aspect of the disclosure, a low noise amplifier (LNA) is provided, comprising: a plurality of transistors configured in a cascode configuration; an inductor with a first terminal of the inductor coupled to an RF input; a DC decoupling element with a first terminal of the DC decoupling element coupled to a second terminal of the inductor and a second terminal of the DC decoupling element coupled to a gate of a transistor in the cascode configuration, and the DC decoupling element further comprising a parallel connection of a plurality of series connected switches and capacitors.

According to a second aspect of the disclosure, a method of tuning an input of a low noise amplifier (LNA) into one or more frequency bands is disclosed, the method comprising: providing an inductor in series with a parallel arrangement of switchable capacitors at an LNA input; and for each frequency band, switching in corresponding one or more capacitors, thereby tuning the LNA into the frequency band through the inductor and the one or more capacitors switched in while decoupling direct current (DC) through the one or more capacitors switched in.

Further aspects of the disclosure are provided in the description, drawings and claims of the present application.

DETAILED DESCRIPTION

According to the teachings of the present disclosure, DC decoupling capacitors may be used as part of the input tuning circuits of LNAs to tune the LNA input to multiple bands while providing the decoupling functionality.

Figure 1:
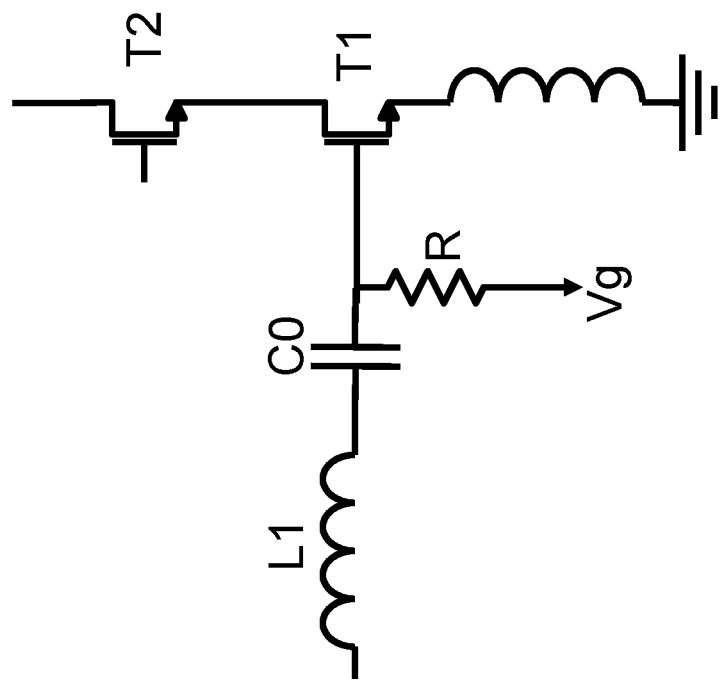
FIG. 1 shows a prior art LNA.
Figure 2:
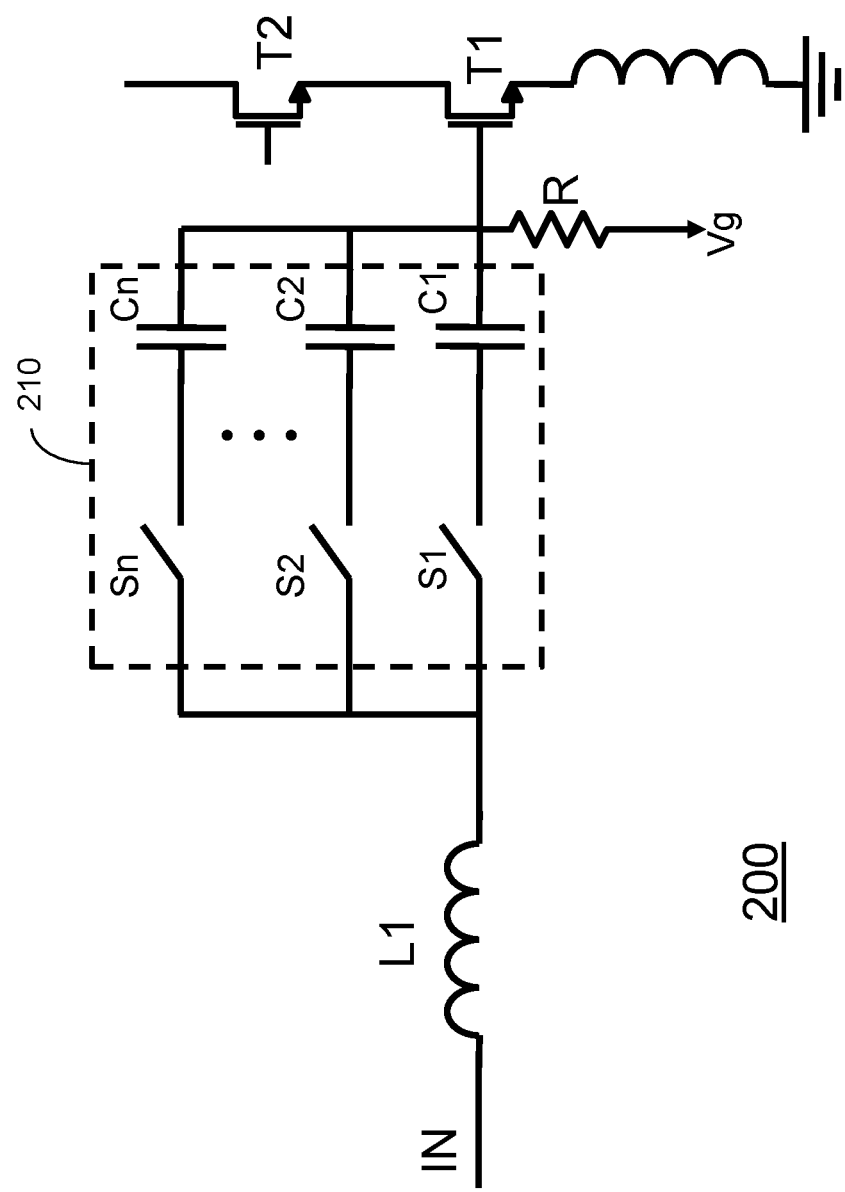
FIG. 2 shows an exemplary LNA in accordance with an embodiment of the present disclosure.

FIG. 2 shows an LNA (200) in accordance with an embodiment of the present disclosure. LNA (200) comprises transistors (T1, T2) configured in cascode and served as the amplification part of the LNA (200). The LNA (200) further comprises a DC decoupling element (210) connected serially to inductor (L1) at one end and to the gate of transistor (T1) at another end. Inductor (L1) is used to tune the input to one or more frequency bands. The gate bias voltage is provided through resistor (R) by the bias voltage (Vg). An input signal to be amplified is applied to the LNA (200) at input node (IN).

With further reference to FIG. 2, the DC decoupling element (210) comprises a plurality of DC capacitors (C1, ..., Cn), wherein each capacitor is serially connected to a corresponding switch of a plurality of switches (S1, ..., Sn). According to an embodiment of the present disclosure, the plurality of capacitors (C1, ..., Cn) may be used both for DC decoupling and input tuning at the same time. As a first exemplary operative condition, when switches (S1, S2) are closed and the rest of the switches are open, a combination of capacitors (C1, C2) is adopted for DC decoupling, and at the same time, the combinations of such capacitors together with inductor (L1) may be used for input tuning purposes wherein the input of the LNA may be tuned to a desired frequency band with a required center and bandwidth. As a second exemplary operative condition, when switch (Si) is closed and the rest of the switches are open, the corresponding capacitor (Ci) DC decouples the input from the rest of the circuit while a combination of capacitor (Ci) and inductor (L1) may be designed to tune into a different frequency band with a desired bandwidth and center frequency. In view of what described, the plurality of the switches (C1, ..., Cn) may have various states, each in correspondence with a frequency band of the multiple bands the LNA (200) is desired to tune into. In each switching state, one or more capacitors from the plurality of capacitors (C1, ..., Cn) are switched in to tune into a frequency band that corresponds to such switching state.

With continued reference to FIG. 2, the person skilled in the art will appreciate that, by virtue of using the capacitors for both decoupling and input tuning purposes, design of lower cost LNAs is made possible based on the teachings of the present disclosure. Moreover, by requiring no additional inductors, less space may be required to implement such LNAs. Additionally, LNAs with multiband tunability may also be made by assigning one or more capacitors to each required frequency band. The person skilled in the art will also appreciate that, in applications where the exact center frequency and bandwidth of the frequency bands are known, highly accurate tuning may be achieved by careful selection of the capacitor (C1, ..., Cn) and corresponding switching schemes.

In accordance with various embodiments of the present disclosure:

The LNA (200) may be tuned to frequency bands with center frequencies of several GHz and bandwidths in the order of 25% of the center frequencies. By way of example and not of limitation the center frequency of the LNA (200) may be in the range of one to ten GHz.

Any number of capacitors (C1, . . . , Cn) may be switched in or out in a given operating condition, thereby tuning into an arbitrary number of required frequency bands The capacitance values of the plurality of capacitors (C1, . . . , Cn) may be selected according to a binary scheme or any other arbitrary value for desired bands The plurality of capacitors (C1, . . . , Cn), resistor (R) and transistors (T1, T2) may be implemented on a same chip Inductor (L1) may be implemented off-chip or on-chip The IC may be implemented in a variety of processes. One example is a CMOS SOI process.

Any number of transistors, arranged in a cascode configuration may be implemented In operative conditions, the DC voltage (Vg) appears across each capacitor that is switched in Two or more bands of the multiple bands may be tuned into by switching in a) only one capacitor at a time, or b) two or more capacitors at a time, or c) a combination thereof The LNA (200) may further comprise Power Amplifiers and/or RF amplifiers.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

The invention claimed is:

1. A low noise amplifier (LNA) comprising:
a plurality of transistors configured in a cascode configuration;
an inductor with a first terminal of the inductor coupled to an RF input;
a DC decoupling element with a first terminal of the DC decoupling element coupled to a second terminal of the inductor and a second terminal of the DC decoupling element coupled to a gate of a transistor in the cascode configuration, and
the DC decoupling element further comprising a parallel connection of a plurality of series connected switches and capacitors.

2. The LNA of claim 1, wherein the DC decoupling element is configured such that the capacitors are closest to the gate of the transistor.

3. The LNA of claim 2, wherein the switches can be controlled to ON or OFF states to alter an input impedance match.

4. The LNA of claim 1, wherein the capacitors, the switches and the plurality of transistors are all implemented on a single chip.

5. The LNA of claim 4, wherein the single chip is a complementary metal-oxide-semiconductor (CMOS) chip.

6. The LNA of claim 4, wherein the single chip is a silicon-on-insulator (SOI) chip.

7. The LNA of claim 4, wherein the switches comprise CMOS switches.

8. The LNA of claim 4, wherein the inductor is implemented outside the chip.

9. The LNA of claim 1, wherein capacitance values of the capacitors are selected based on a binary scheme.

10. The LNA of claim 1, wherein two or more of the one or more frequency bands are tuned into by switching in a) one capacitor at a time, b) two or more capacitors at a time, or c) a combination thereof.

11. The LNA of claim 1, wherein a frequency band of the one or more frequency bands has a center frequency in the range of 1 to 10 GHz.

12. The LNA of claim 1, wherein the frequency band of the one or more frequency bands has a bandwidth within the range of 20% to 25% of the center frequency.

13. The LNA of claim 1, further comprising a bias resistor coupling bias voltage to the input of the transistor of the plurality of the transistors.

14. The LNA of claim 1, wherein the switches are configured according to a frequency band of operation.

* * * * *